(12) United States Patent
Boehm

(10) Patent No.: US 8,724,709 B2
(45) Date of Patent: May 13, 2014

(54) METHOD FOR A HYBRID GOLOMB-ELIAS GAMMA CODING

(75) Inventor: Johannes Boehm, Goettingen (DE)

(73) Assignee: Thomson Licensing, Issy les Moulineaux (FR)

( * ) Notice: Subject to any disclaimer, the term of this patent is extended or adjusted under 35 U.S.C. 154(b) by 231 days.

(21) Appl. No.: 12/737,258

(22) PCT Filed: Jun. 25, 2009

(86) PCT No.: PCT/EP2009/057940
§ 371 (c)(1),
(2), (4) Date: Mar. 2, 2011

(87) PCT Pub. No.: WO2010/000662
PCT Pub. Date: Jan. 7, 2010

(65) Prior Publication Data
US 2011/0150097 A1    Jun. 23, 2011

(30) Foreign Application Priority Data

Jul. 1, 2008 (EP) .................................. 08159434

(51) Int. Cl.
*H04N 11/02* (2006.01)
(52) U.S. Cl.
USPC .................................. 375/240.25
(58) Field of Classification Search
USPC ....................... 375/240.01–240.29
See application file for complete search history.

(56) References Cited

U.S. PATENT DOCUMENTS

| | | | |
|---|---|---|---|
| 6,028,541 A | 2/2000 | Levine et al. | |
| 6,272,180 B1 * | 8/2001 | Lei | 375/240.16 |
| 6,567,562 B1 | 5/2003 | Nakayama et al. | |
| 6,650,784 B2 * | 11/2003 | Thyagarajan | 382/244 |
| 6,711,295 B2 | 3/2004 | Nakayama et al. | |

(Continued)

FOREIGN PATENT DOCUMENTS

| | | |
|---|---|---|
| CN | 1550104 | 11/2004 |
| JP | 2000115770 | 4/2000 |
| JP | 2000115782 | 4/2000 |
| JP | 2006339990 | 12/2006 |

OTHER PUBLICATIONS

Kirchhoffer et al., "Context-Adaptive Binary Arithmetic Coding for Frame-Based Animated Mesh Compression", Multimedia and Expo, 2008 IEEE International Conference, Jun. 23, 2008, pp. 341-344.

(Continued)

*Primary Examiner* — David Czekaj
*Assistant Examiner* — Leron Beck
(74) *Attorney, Agent, or Firm* — Myers Wolin LLC

(57) ABSTRACT

The invention relates to a method for encoding of a bit amount of a data section and to a corresponding decoding method. Furthermore, the invention relates to encoding, decoding, transmission and/or storage of audio and/or video data wherein said method for encoding of a bit amount of a data section and/or said corresponding decoding method are used in processing of the audio and/or video data. Said method for encoding of a bit amount of a data section comprises the steps of encoding said bit amount indicating integer as a first number of equally valued bits followed by a stop bit of different value wherein said first number equals said bit amount increased by a threshold value. Using said method, quotients of values larger than a threshold can be encoded using unary as well as binary code wherein quotients of values smaller than the threshold can be encoded in unary code.

7 Claims, 4 Drawing Sheets

Figure 1:
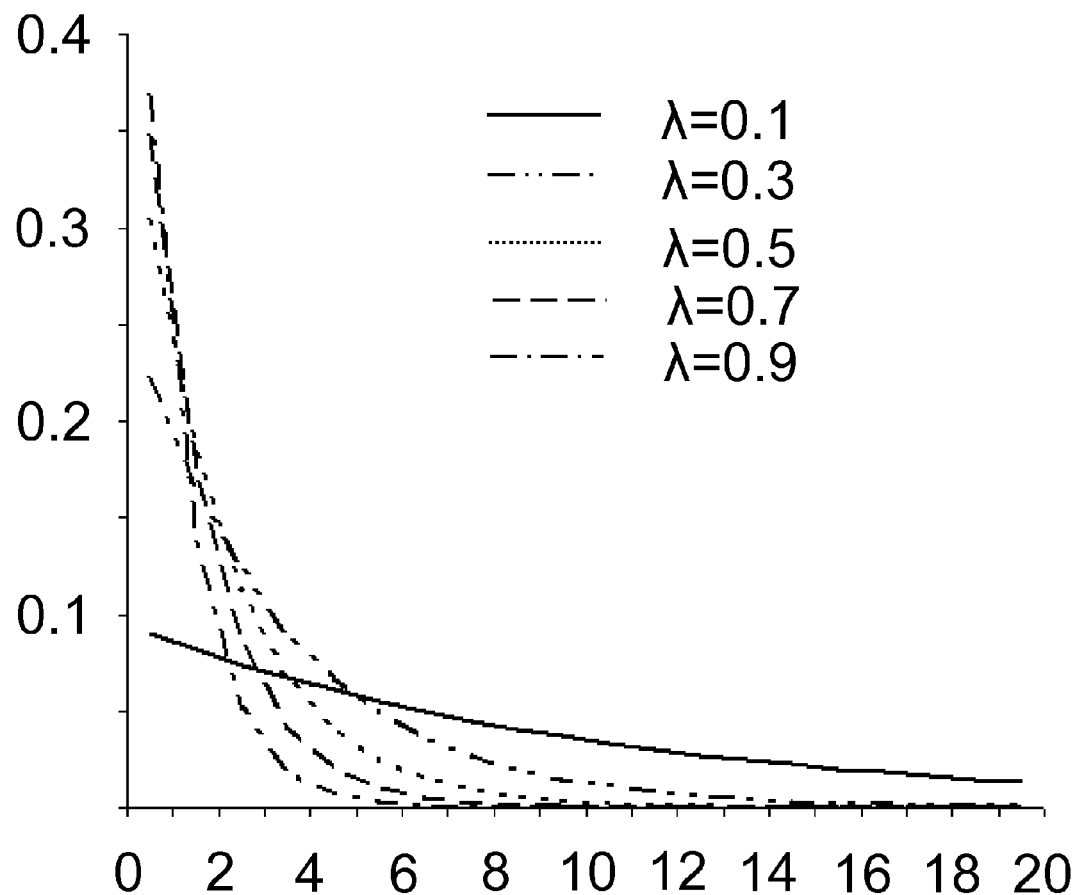

| Probability \ Golomb factor | 1 | 2 | 3 | 4 | 5 | 6 | 7 |
|---|---|---|---|---|---|---|---|
| 0.9 | 4 | 3 | 3 | 3 | 3 | 3 | 3 |
| 0.99 | 7 | 7 | 7 | 7 | 7 | 7 | 7 |
| 0.999 | 10 | 10 | 10 | 10 | 10 | 10 | 10 |
| 0.9999 | 14 | 14 | 14 | 14 | 14 | 14 | 14 |
| 0.99999 | 17 | 17 | 17 | 17 | 17 | 17 | 17 |
| 0.999999 | 20 | 20 | 20 | 20 | 20 | 20 | 20 |
| 0.9999999 | 24 | 23 | 23 | 23 | 23 | 23 | 23 |
| 0.99999999 | 27 | 27 | 27 | 27 | 27 | 27 | 27 |
| 0.999999999 | 30 | 30 | 30 | 30 | 30 | 30 | 30 |

(56) References Cited

U.S. PATENT DOCUMENTS

| | | | |
|---|---|---|---|
| 7,259,698 B2 | 8/2007 | Ishikawa | |
| 7,486,211 B2 * | 2/2009 | Lin et al. | 341/67 |
| 2003/0026335 A1 | 2/2003 | Thyagarajan et al. | |
| 2004/0008769 A1 | 1/2004 | Winger | |

OTHER PUBLICATIONS

Anonymous, "Exponential-Golomb Coding", [Online], Retrieved from the Internet: <URL: http://en.wikipedia.org/w/index.php?title=Exponential-Golomb_coding&oldid=19444 499>, Feb. 27, 2008, pp. 1-2.

Winger, "Putting a Reasonable Upper Limit on Binarization Expansion", Joint Video Team (JVT) of ISO/IEC MPEG & ITU-T VCEG, Document: JVT-C162, 3rd Meeting: Fairfax, VA, May 6-10, 2002.

Marpe et al., "Context-Based Adaptive Binary Arithmetic Coding in the H.264/AVC Video Compression standard", IEEE Transactions on Circuits and Systems for Video Technology, vol. 13, No. 7, Jul. 2003.

* cited by examiner

| Probability \ Golomb factor | 1 | 2 | 3 | 4 | 5 | 6 | 7 |
|---:|---|---|---|---|---|---|---|
| 0.9 | 4 | 3 | 3 | 3 | 3 | 3 | 3 |
| 0.99 | 7 | 7 | 7 | 7 | 7 | 7 | 7 |
| 0.999 | 10 | 10 | 10 | 10 | 10 | 10 | 10 |
| 0.9999 | 14 | 14 | 14 | 14 | 14 | 14 | 14 |
| 0.99999 | 17 | 17 | 17 | 17 | 17 | 17 | 17 |
| 0.999999 | 20 | 20 | 20 | 20 | 20 | 20 | 20 |
| 0.9999999 | 24 | 23 | 23 | 23 | 23 | 23 | 23 |
| 0.99999999 | 27 | 27 | 27 | 27 | 27 | 27 | 27 |
| 0.999999999 | 30 | 30 | 30 | 30 | 30 | 30 | 30 |

Fig. 2

| Integer value range | Prefix |
|---|---|
| 0-1 | 1 |
| 2-3 | 01 |
| 4-5 | 001 |
| 6-7 | 0001 |
| 8-9 | 000010 |
| 10-11 | 000011 |
| 12-13 | 00000100 |
| 14-15 | 00000101 |
| 16-17 | 00000110 |
| 18-19 | 00000111 |
| 20-21 | 0000001000 |
| 22-23 | 0000001001 |
| 24-25 | 0000001010 |
| 26-27 | 0000001011 |
| 28-29 | 0000001100 |
| 30-31 | 0000001101 |
| 32-33 | 0000001110 |
| 34-35 | 0000001111 |
| 36-37 | 000000010000 |
| 38-39 | 000000010001 |
| 40-41 | 000000010010 |

Fig. 3

| Integer value range | Prefix |
|---|---|
| 0-3 | 1 |
| 4-7 | 01 |
| 8-11 | 001 |
| 12-15 | 0001 |
| 16-20 | 00001 |
| 20-23 | 000001 |
| 24-27 | 0000001 |
| 28-31 | 00000001 |
| 32-35 | 0000000010 |
| 36-39 | 0000000011 |
| 40-43 | 000000000100 |
| 44-47 | 000000000101 |
| 48-51 | 000000000110 |
| 52-55 | 000000000111 |
| 56-59 | 00000000001000 |
| 60-63 | 00000000001001 |
| 64-67 | 00000000001010 |
| 68-71 | 00000000001011 |
| 72-75 | 00000000001100 |
| 76-79 | 00000000001101 |
| 80-83 | 00000000001110 |

Fig. 4

METHOD FOR A HYBRID GOLOMB-ELIAS GAMMA CODING

This application claims the benefit, under 35 U.S.C. §365 of International Application PCT/EP2009/057940, filed Jun. 25, 2009, which was published in accordance with PCT Article 21(2) on Jan. 7, 2010 in English and which claims the benefit of European patent application No. 08159434.3, filed Jul. 1, 2008.

BACKGROUND

The invention relates to a method for encoding of a bit amount of a data section and to a corresponding decoding method. Furthermore, the invention relates to encoding, decoding, transmission and/or storage of audio and/or video data wherein said method for encoding of a bit amount of a data section and/or said corresponding decoding method are used in processing of the audio and/or video data.

Different variable length coding schemes for lossless encoding of integers had been proposed. For instance, Elias, P., describes in: "Universal Codeword Sets and Representations of the Integers"; IEEE Trans. on Inf. Theo., IT-21:2, March 1975; pp 194-203 so-called Gamma code for integers larger than 1. Gamma code consists of variable length binary code of the encoded integer from most significant bit (MSB) to least significant bit (LSB) preceded by a unary code of the length of the binary code diminished by 1.

Other variable length coding schemes are described by Golomb, S. W., in: "Run-length Coding", IEEE Trans. on Inf. Theo., IT-12:4, July 1966; pp 399-401, and by Rice, R. F., in: "Same Practical Universal Noiseless Coding Techniques"; Jet Propulsion Laboratory; JPL Publication 79-22; Pasadena Cal.; March 1979, are well suited for to-be-coded values having probabilities of occurrence which follow Geometric/Laplace like distribution functions.

Golomb coding is parameterized by a Golomb factor. This allows for adjusting Golomb coding to the concrete distribution function of the data to-be-encoded.

Golomb code consists of a prefix of unary code, i.e. a corresponding number of equally valued bits, representing a quotient separated by a separator bit, i.e. a bit of different value than said equally valued bits, from a suffix of binary code of fixed length representing a remainder. Said fixed length corresponds to the bit amount required for binary encoding the Golomb factor. That is, the fixed number equals the integer part of the logarithm of the Golomb factor to the base of 2, said integer part being increased by 1. The integer encoded can be retrieved by retrieving the quotient through reading and counting equally valued bits until the separator bit is read and then reading and decoding the remainder from the following fixed number of bits. Then, the quotient is multiplied with the Golomb factor before it is added the reminder.

For encoding, the quotient is determined as the integer part of the value to-be-encoded divided by the Golomb factor and the remainder is determined as the difference between the value to-be-encoded and the determined quotient times the Golomb factor.

Rice coding is a special case of Golomb coding where the Golomb factor equals 2 raised to the power of a so-called Rice coefficient and the size of the part carrying binary code equals said Rice coefficient.

By construction, the shortest Golomb codes comprise at least said fixed number of bits and the separator bit.

Thus, the larger the Golomb factor the larger is the fixed number and the larger is the code for the small integers. But as well, the shorter is the code for large integers. Disadvantageously, although most of the values to-be-encoded in audio data and/or video data follow a Geometric/Laplace like distribution function, there are some large values to-be-encoded which are rare but more likely to occur than predicted by a distribution function fitted to frequently occurring smaller values.

So, when adjusting the Golomb factor to a distribution function fitted to the frequently occurring smaller values, only, the Golomb factor is chosen that small that said large values require an enormous unary part and thus result in a data rate explosion.

And, when adjusting the Golomb factor to a distribution function fitted to all values, the Golomb factor is chosen that large that said frequently occurring smaller values are coded with more bits then necessary which also results in a data rate explosion.

There is a need for efficient encoding of values following such hybrid distributions.

INVENTION

The invention engages in this need and proposes a method for encoding an integer indicating a bit amount of a data section, said method comprising the features of claim 1.

Said method comprises the steps of encoding said bit amount indicating integer as a first number of equally valued bits followed by a stop bit of different value wherein said first number equals said bit amount increased by a threshold value.

By help of said method, the quotient of said rare large values larger than the threshold times the Golomb factor can be encoded in a hybrid code carrying unary as well as binary code wherein the Golomb factor may be fitted to the frequently occurring small values, only. And, the quotients of values smaller than the threshold times the Golomb factor can still be encoded in unary code.

For decoding a bit amount of a data section, a decoding method according claim 4 is proposed wherein said decoding method comprises the steps of reading and counting a first number of equally valued bits until a separator bit of different value is read and determining the bit amount by decreasing said first number by a threshold value.

In an embodiment said decoding method, determining the second number comprises determining the second number equal to the adjuvant integer increased by 1 and diminished by the threshold value and by 2 raised to the power of said first number.

The invention further proposes another method for encoding wherein an adjuvant integer is encoded in a prefix of a variable length code of a main integer, said another method comprising the features of claim 2.

That is, said another method comprises the steps of comparing said adjuvant integer with a threshold value, if said adjuvant integer is smaller than said threshold value, encoding said adjuvant integer as a corresponding number of equally valued bits followed by a separator bit of different value, and, if said adjuvant integer is larger than said threshold value, determining a second number using said first number, said adjuvant integer and said threshold value, encoding said support integer binary, determining a size of the second number's binary code and prepending a code of said size to said binary code, said code of said size being determined according to claim 1.

For decoding an adjuvant integer from a prefix of a variable length encoded main integer, another decoding method according to claim 5 is proposed. Said another decoding method comprises the steps of determining a bit amount of a data section according to claim 4, comparing said first number with a threshold value, if said first number is smaller than said threshold value, determining the adjuvant integer equal to said first number, and if said first number is larger than said threshold value, reading said bit amount of subsequent bits, decoding a binary coded second number from said read bit amount and using the threshold value, the first number and the second number, also, for determining the adjuvant integer.

In an embodiment said decoding method, the adjuvant integer equals the sum of the threshold value diminished by 1, the second number and 2 raised to the power of said first number if said bit amount is larger than Zero.

Other embodiments of said method, said decoding method, said another method or said another decoding method further comprise that binary code of a remainder is comprised in a suffix of a predefined number of bits and the main integer is determinable as the sum of said adjuvant integer multiplied by said predefined number and said remainder.

Yet other embodiments of said method, said decoding method, said another method or said another decoding method further comprise that the main integer is comprised in a set of integers, the method comprises encoding or decoding the integers of the set and the threshold value depends on said predefined number and on a maximum value.

Even yet other embodiments of said method, said decoding method, said another method or said another decoding method further comprise that said maximum value is determined by help of a set of test data.

Further other embodiments of said method, said decoding method, said another method or said another decoding method further comprise that said maximum value is determined by help of said predefined number and an occurrence probability.

Yet further other embodiments of said method, said decoding method, said another method or said another decoding method further comprise that at least some of said integers of the set are sequentially encoded or sequentially decoded and said maximum value used for encoding or decoding a subsequent integer is adapted towards being the maximum among a number of lastly encoded or decoded integers.

The more, a method for encoding or decoding audio and/or video data, said method comprises the features of claim 12 is proposed. It comprises determining data representing one or more residuals of transient time data or tonal spectral data of said audio signal and/or video data and encoding or decoding integers comprised in said representing data according to one of the proposed other embodiments of the proposed another encoding method or decoding method, respectively.

And, a method for transmitting audio and/or video data is proposed wherein said method comprises encoding the audio and/or video data according to the proposed method for encoding or decoding audio and/or video data, wherein said integers comprised in said representing data are encoded according to the proposed yet further other embodiment of the proposed another encoding method, transmitting the encoded data and decoding the audio and/or video data from the encoded data according to the proposed method for encoding or decoding audio and/or video data, wherein said integers comprised in said representing data are decoded according to the proposed yet further other embodiment of the proposed another decoding method.

Furthermore, a storage medium comprising audio and/or video data encoded according to the proposed method for encoding or decoding audio and/or video data is proposed.

DRAWINGS

Exemplary embodiments of the invention are illustrated in the drawings and are explained in more detail in the following description.

In the figures:

FIG. 1 depicts a table of integer value ranges and corresponding prefixes according to an exemplary embodiment of an hybrid Golomb coding scheme with a Golomb factor of 2 and a threshold of 3, FIG. 2 depicts a table of integer value ranges and corresponding prefixes according to an exemplary embodiment of an hybrid Golomb coding scheme with a Golomb factor of 2 and a threshold of 3, FIG. 3 depicts a table of prefixes and suffixes in an exemplary embodiment of an hybrid Golomb coding scheme with a Golomb factor of 4 and a threshold of 6 and FIG. 4 depicts a table of exemplarily thresholds determined by help of different occurrence probabilities and different Golomb factors.

EXEMPLARY EMBODIMENTS

The invention proposes to smooth down the bit length increase for values larger than a threshold m by encoding the prefix of such values with a modified Elias-Gamma Code. The coding of values smaller than threshold m the prefix is encoded by unary code, only. For all values, encoding of the remainder in the fixed code part of the Golomb/Rice code, i.e. the suffix, remains unchanged.

The modified Elias-Gamma Code used for prefix encoding has a unary part which is by the threshold value m larger than a subsequent binary part. This allows telling apart the unary part of the modified Elias-Gamma Code from prefixes of encoded values smaller than the threshold value m which have a prefix consisting of unary code, only.

Golomb/Rice coding schemes are suited if the assumption that the probability of occurrence of values x to-be-coded follows Geometric/Exponential like distributions holds. Then, length of Golomb/Rice code for value x is proportional to the probability of occurrence of values x. Geometric/Exponential like distributions can be written as follows:

$$f(x; \lambda) = \begin{cases} \lambda e^{-\lambda x} & \text{for } x \geq 0 \\ 0 & \text{otherwise.} \end{cases} \quad (1)$$

FIG. 1 depicts x-value/probability-plots of examples of Geometric/Exponential like probability distributions for different values of $\lambda$.

If an exponential probability density distribution function of the values of a block of data to-be-encoded is assumed, Golomb coding is the coding scheme of choice. The Golomb factor G is determined using a Median estimate of the distribution by calculating the mean M of the block of data (1/M is the maximum likelihood estimate for the rate parameter $\lambda$):

$$G = \frac{\ln(2)}{\lambda} = \ln(2) * M \quad (2)$$

The median splits the (ordered) block of data to be coded into half. All values below the median (half the values) can be coded with a minimum quotient of 0 (coded as one bit) and $N_r = \text{int}(\log_2(G)) + 1$ or $N_r - 1$ bits for the remainder r. This approximates an optimal Huffman code.

But, when coding residuals of transient time data or tonal spectral data (data with large sparse peeks), the assumption of a classic exponential distribution probability density distribution function gives only a very rough approximation of the probability of occurrence of values. Especially values larger than a threshold m occur more often than predicted by an exponential distribution probability density distribution function.

This problem can be overcome by using a hybrid coding approach for coding the quotient q. The proposed code has a tuning parameter m which determines whether quotient q is encoded according to prior-art Golomb/Rice coding or whether it is encoded by a modified Elias Gamma code.

Threshold value m may be fixed for a codec system. Then, it may be useful to determine the threshold m, such that the overall code length of a set of suitable exemplary data is minimized.

Or, threshold m has a default start value which is updated in response to some or all data already encoded. For instance, the last n encoded values are kept in a first-in/first-out-memory and used for updating. Then, the updated threshold has to be transmitted to the decoder as side information. Or, the same threshold updating process takes place on the encoder side and on the decoder side.

Exemplarily, the largest value $V_{max}$ among the last n encoded values kept in the first-in/first-out-memory is used for determining threshold m by help of Golomb factor G as follows:

$$m = \left[\left(\frac{(V_{max}+1)}{G}\right)\right] \quad (1)$$

wherein [.] returns the integer part of its argument.

Instead of the largest value $V_{max}$ among the last n encoded values kept in the first-in/first-out-memory, an estimated largest value $\tilde{V}_{max}$ may be used in equation (1). The estimate $\tilde{V}_{max}$ of the largest value depends on an occurrence probability threshold p and may be determined as:

$$\tilde{V}_{max} = \frac{\ln(1-p)}{\ln(0.5)} G \quad (2)$$

Then, threshold m may be determined as:

$$m = \left[\left(\frac{1}{G} + \frac{\ln(1-p)}{\ln(0.5)}\right)\right] \quad (3)$$

A table with exemplary values for threshold m determined according to equation (3) is shown in FIG. 2. As can be seen from said table, the threshold m does not vary much for a fixed probability threshold p and varying Golomb factor G larger than 1. The more, there are only two exemptions where the threshold value for a fixed probability threshold p is larger for G=1 than for other values of G. Therefore, threshold m may also be determined as:

$$m = \left[\frac{\ln(1-p)}{\ln(0.5)}\right] \quad (4)$$

Probability threshold p corresponds to the probability that a value smaller than the estimate $\tilde{V}_{max}$ of the largest value will occur. The probability, that one of the values equal to or larger than $\tilde{V}_{max}$ will occur, equals 1−p.

As can be seen from the table in FIG. 2, probability threshold p=0.9 and Golomb factor G>1 yields a threshold value m=3. That is, the probability of occurrence of a value for which the prefix is encoded by help of said modified Elias Gamma coding is 0.1.

Prefixes for Golomb factor G=2 and threshold value m=3 are shown in the table of FIG. 3. The dashed line indicates at which integer range to-be-encoded the prefix is changed from pure unary code to a code comprising a unary part and a binary part. That is, integers up to a value of 7 are encoded with a prefix of solely unary code. Values larger than 7 are encoded with a prefix comprising said modified Elias Gamma code. Thus, if it is known that 90% of the occurring values are smaller than 8, a threshold value m=3 may be chosen.

There is a interval of values larger than 7 and smaller 16 wherein encoding of said values with a modified Elias gamma prefix requires as much or even more bits than coding with a unary prefix. The additional bit required is depicted in bold.

Such interval can be observed for any G and m.

The boundaries of said interval $]V_0,V_4]$ can be determined as:

$$V_0 = G*(m+1)-1 \quad (5)$$

$$V_4 = V_0 + 4*G \quad (6)$$

Given G, the interval can be moved by selection of threshold m.

As can be seen from the table in FIG. 2, probability threshold p=0.99 and Golomb factor G>1 yields a threshold value m=7. That is, the probability of occurrence of a value for which the prefix is encoded by help of said modified Elias Gamma coding is 0.01.

Prefixes for Golomb factor G=4 and threshold value m=7 are shown in the table of FIG. 4. The dashed line indicates at which integer range to-be-encoded the prefix is changed from pure unary code to a code comprising a unary part and a binary part. That is, integers up to a value of 31 are encoded with a prefix of solely unary code. Values larger than 31 are encoded with a prefix comprising said modified Elias Gamma code. Thus, if it is known that 99% of the occurring values are smaller than 31, a threshold value m=7 may be chosen.

As in the first example, there is a interval of values larger than 31 and smaller 16 wherein encoding of said values with a modified Elias gamma prefix requires as much or even more bits than coding with a unary prefix. The additional bit required is depicted in bold.

In an exemplary method for encoding value V, the following steps are performed:
 1. Determining a quotient $$q = \left[\frac{V}{G}\right]$$

and a remainder R=V−q*G.
 2. Comparing quotient q with threshold m.
 3. If the quotient q is equal to or smaller than threshold m, quotient q is coded in a prefix using the regular unary representation, i.e. q '0' bits followed by a '1' as a stop bit or vice versa. Then the prefix code length is q+1 bits.
 4. If the quotient q is larger than threshold m, two adjuvant integers U and B are determined as follows:

$$U = [\log_2(q-m+1)]+m \quad (7)$$

$$B = q-m+1-2^{U-m} \quad (8)$$

5. The prefix code is formed as regular unary representation of U, i.e. U '0' bits followed by a '1' as a stop bit or vice versa, followed by regular binary representation of B. Then the prefix code length is $m+2*[\log_2(q-m+1)]+1$ bits.

6. Append a binary representation of remainder R, said binary representation being comprised in G bits.

In an exemplary method for decoding a value V', the following steps are performed:

1. Count number C of '0' valued bits until stop bit of value '1' is read. The stop bit is not taken into account for determining C.
2. Comparing count number C with threshold m.
3. If the count number C is equal to or smaller than threshold m, a quotient q' is equal to count number C.
4. If the count number C is larger than threshold m, another adjuvant integer U' is determined as follows:

$$U=C-m \quad (9)$$

and the U bits following the stop bit are read and interpreted as binary code of another adjuvant integer B'. Quotient q' is then determined as:

$$q'=B'+2^{U'}+m-1 \quad (10)$$

5. Reading and interpreting the following G bits as binary code of a remainder R'.
6. Determine value V' as follows:

$$V'=q'*G+R' \quad (11)$$

The invention is especially useful for lossless encoding of audio and/or video signals but is suited for other signals, also. The invention may be used to encode an audio signal for transmission or broadcasting via radio or cable to one or more receiving devices. Or, the encoded signal is stored in a storage medium, for instance an optical storage medium like a CD, a DVD or a Blu-Ray Disk.

The invention claimed is:

1. Method for encoding an integer, said method comprises:
   determining a threshold value,
   dividing the integer by a predetermined number and determining a quotient being an integer part of the divided integer,
   determining a remainder being the integer diminished by the quotient multiplied by the predetermined number comparing said quotient with the threshold value,
   when said quotient is smaller than or equal to said threshold value, encoding said quotient using unary representation, and,
   when said quotient is larger than said threshold value, determining a difference between said quotient increased by 1 and said threshold value, determining a first adjuvant integer as the integer part of the logarithm, to the base of 2, of the determined difference plus said threshold value, encoding said first adjuvant integer using unary representation, determining a second adjuvant integer as difference between the determined difference and 2 raised to the power of said first adjuvant integer minus said threshold, and encoding the second adjuvant integer using binary representation, and
   binary encoding the remainder in the predetermined number of bits, wherein
   the threshold is determined as the integer part of a further quotient obtained by dividing a maximum value for the integer plus 1 by said predetermined number, wherein
   the maximum value is determined as, either, a maximum among a set of exemplary test data, or, an estimated maximum determined using an occurrence probability threshold and the predetermined number.

2. Method for decoding an encoded integer, said method comprises:
   decoding a unary coded portion at the beginning of the integer to obtain a count number,
   comparing said count number with a threshold value, wherein
   when said count number is smaller than or equal to said threshold value, determining a quotient equal to said count number,
   and when said count number is larger than said threshold value, determining a first decoded adjuvant integer as a difference between said count number and said threshold, reading a number of subsequent bits, the number of subsequent bits read corresponding to the first decoded adjuvant integer, decoding a binary coded second decoded adjuvant integer from the subsequent bits read and determining a quotient as the sum of 2 raised to the power of the first decoded adjuvant integer, the threshold and the second decoded adjuvant integer diminished by 1,
   reading a predetermined number of subsequent further bits, and decoding a binary coded remainder from the number of subsequent further bits read, and
   determining the integer as the sum of the quotient multiplied by said predetermined number and the remainder.

3. Method according to claim 1, wherein, in case the test data maximum is determined, the set of exemplary test data consists of recently encoded integers.

4. Method according to claim 2, further comprising:
   determining a maximum among a number of recently decoded integers,
   increasing the determined maximum by 1,
   determining a further quotient by dividing the increased maximum by the predetermined number and
   determining the threshold as the integer part of the further quotient.

5. Device for encoding audio signals, wherein residual of transient time data or tonal spectral data of the audio signals are represented by integers, said device being adapted for encoding the integers according to the method of claim 1.

6. Device for decoding audio signals, wherein residuals of transient time data or tonal spectral data of the audio signals are represented by integers, said device being adapted for decoding the integers according to the method of claim 2.

7. A non-transitory storage medium comprising encoded integers representing residuals of transient time data or tonal spectral data of the audio signals, the integers being encoded according to the method of claim 1.

* * * * *